United States Patent
Sadohara et al.

(10) Patent No.: US 10,966,327 B2
(45) Date of Patent: Mar. 30, 2021

(54) METHOD FOR FORMING CIRCUIT ON SUBSTRATE

(71) Applicant: JCU CORPORATION, Taito-ku (JP)

(72) Inventors: Daisuke Sadohara, Tokyo (JP); Kenichi Nishikawa, Kanagawa (JP); Keita Suzuki, Aichi (JP); Kouta Ibe, Kanagawa (JP); Katsumi Shimoda, Kanagawa (JP)

(73) Assignee: JCU CORPORATION, Taito-ku (JP)

(*) Notice: Subject to any disclaimer, the term of this patent is extended or adjusted under 35 U.S.C. 154(b) by 0 days.

(21) Appl. No.: 16/072,091

(22) PCT Filed: Jan. 29, 2016

(86) PCT No.: PCT/JP2016/052625
§ 371 (c)(1),
(2) Date: Jul. 23, 2018

(87) PCT Pub. No.: WO2017/130373
PCT Pub. Date: Aug. 3, 2017

(65) Prior Publication Data
US 2019/0029126 A1     Jan. 24, 2019

(51) Int. Cl.
*H05K 3/46*         (2006.01)
*H01L 21/288*       (2006.01)
(Continued)

(52) U.S. Cl.
CPC ....... *H05K 3/4661* (2013.01); *C23C 18/1641* (2013.01); *C23C 18/1653* (2013.01);
(Continued)

(58) Field of Classification Search
USPC .............................................. 427/98.4, 99.1
See application file for complete search history.

(56) References Cited

U.S. PATENT DOCUMENTS 6,344,242 B1 * 2/2002 Stolk .................... B01J 13/0026
                                                        106/1.11
6,863,923 B1 * 3/2005 Kalleder .................. B41M 1/12
                                                        106/287.1
(Continued)

FOREIGN PATENT DOCUMENTS

EP     0280918     *  5/1988
EP   0 280 918 A2     9/1988
(Continued)

OTHER PUBLICATIONS

International Search Report dated May 10, 2016, in PCT/JP2016/052625 filed Jan. 29, 2016.
(Continued)

*Primary Examiner* — Brian K Talbot
(74) *Attorney, Agent, or Firm* — Oblon, McClelland, Maier & Neustadt, L.L.P.

(57) ABSTRACT

A new method capable of forming a circuit by performing metal plating on a desired portion on a substrate through a small number of steps regardless of the kind of the substrate. A method for forming a circuit on a substrate characterized in that when forming a circuit by plating on a substrate, the method includes steps of applying a coating film containing a silicone oligomer and a catalyst metal onto the substrate, and thereafter, performing an activation treatment of the catalyst metal in the coating film to make the catalyst metal exhibit autocatalytic properties, and then, performing electroless plating.

19 Claims, 2 Drawing Sheets

(51) Int. Cl.

| | |
|---|---|
| *C23C 18/18* | (2006.01) |
| *C23C 18/20* | (2006.01) |
| *C25D 5/02* | (2006.01) |
| *C23C 18/16* | (2006.01) |
| *C23C 18/30* | (2006.01) |
| *B05D 5/12* | (2006.01) |
| *B05D 3/06* | (2006.01) |
| *H05K 3/18* | (2006.01) |

(52) U.S. Cl.
CPC ...... *C23C 18/1689* (2013.01); *C23C 18/1868* (2013.01); *C23C 18/1879* (2013.01); *C23C 18/1882* (2013.01); *C23C 18/204* (2013.01); *C23C 18/206* (2013.01); *C23C 18/2066* (2013.01); *C23C 18/30* (2013.01); *C25D 5/022* (2013.01); *H01L 21/288* (2013.01); *B05D 3/065* (2013.01); *B05D 5/12* (2013.01); *H05K 3/185* (2013.01); *H05K 2203/072* (2013.01)

(56) References Cited

U.S. PATENT DOCUMENTS

| | | | | |
|---|---|---|---|---|
| 7,037,596 | B1 * | 5/2006 | Benthien | A61L 9/01 |
| | | | | 428/334 |
| 2006/0240186 | A1 * | 10/2006 | Nakamura | H01L 21/316 |
| | | | | 427/240 |
| 2007/0132088 | A1 * | 6/2007 | Kariya | H01L 23/49822 |
| | | | | 257/698 |
| 2008/0194726 | A1 * | 8/2008 | Ng | C09D 11/00 |
| | | | | 522/148 |
| 2009/0149554 | A1 | 6/2009 | Ishikawa et al. | |
| 2011/0117271 | A1 | 5/2011 | Barriere et al. | |
| 2015/0257263 | A1 * | 9/2015 | Sethumadhavan | H05K 1/0366 |
| | | | | 257/88 |
| 2016/0157344 | A1 * | 6/2016 | Wang | H05K 3/182 |
| | | | | 174/257 |

FOREIGN PATENT DOCUMENTS

| | | |
|---|---|---|
| JP | 4-364091 A | 12/1992 |
| JP | 2006-89777 A | 4/2006 |
| JP | 2007-70353 A | 3/2007 |
| JP | 2015-201658 A | 11/2015 |

OTHER PUBLICATIONS

Sadohara, D. et al., "Examples of Si Oligomer Applied to Surface Treatment", The Surface Finishing Society of Japan, Koen Taikai Koen Yoshishu, vol. 130th, Sep. 2014, 3 pages.

Saito, M. et al., "New Plating Technology", Kanto Gakuin University Publishing Society, 2011, pp. 281-292.

Extended European Search Report dated Jul. 30, 2019 in European Patent Application No. 16887960.9, 8 pages.

* cited by examiner

METHOD FOR FORMING CIRCUIT ON SUBSTRATE

TECHNICAL FIELD

The present invention relates to a method for forming a circuit on a substrate, and the like.

BACKGROUND ART

The formation of a circuit on a substrate using plating needs to undergo many steps. For example, in the case where the substrate is a resin, steps as follows are performed (NPL 1).

Subtractive Method (A1) Etching or the like is performed on a substrate to roughen the surface.
(A2) Hydrophilicity is imparted to the substrate with a conditioner.
(A3) A catalyst is imparted to the substrate.
(A4) The substrate is subjected to electroless copper plating or electroless Ni plating.
(A5) The substrate is subjected to copper electroplating.
(A6) A resist pattern is formed on a copper electroplating film.
(A7) The unnecessary electroplating film and electroless plating film are stripped and the resist is stripped, whereby a circuit is formed.

Semi-Additive Method (B1) Etching or the like is performed on a substrate to roughen the surface.
(B2) Hydrophilicity is imparted to the substrate with a conditioner.
(B3) A catalyst is imparted to the substrate.
(B4) The substrate is subjected to electroless copper plating or electroless Ni plating.
(B5) A resist pattern is formed on an electroless plating film, and thereafter, copper electroplating is performed.
(B6) The unnecessary resist and the electroless plating film beneath the resist are stripped, whereby a circuit is formed.

Further, full surface and partial plating for decorative plating on a substrate using plating also needs to undergo many steps in the same manner as the above-mentioned formation of a circuit on a substrate.

In this manner, in order to perform metal plating on a desired portion including the formation of a circuit on various substrates, it was necessary to undergo many steps in accordance with the substrates.

CITATION LIST

Non Patent Literature

NPL 1: "New Plating Technology", SAITO Mamoru, et al., Kanto Gakuin University Publishing Society, pp. 281-292

SUMMARY OF INVENTION

Technical Problem

In view of this, an object of the present invention is to provide a new method capable of forming a circuit by performing metal plating on a desired portion on a substrate through a small number of steps regardless of the kind of the substrate.

Solution to Problem

The present inventors made intensive studies in order to achieve the above-mentioned object, and as a result, they found that by using a coating film containing a silicone oligomer and a catalyst metal when forming a circuit, metal plating can be performed on a desired portion through a small number of steps regardless of the kind of the substrate, and thus, completed the present invention.

That is, the present invention is a method for forming a circuit on a substrate characterized in that when forming a circuit by plating on a substrate, the method includes steps of applying a coating film containing a silicone oligomer and a catalyst metal onto the substrate, and thereafter, performing an activation treatment of the catalyst metal in the coating film to make the catalyst metal exhibit autocatalytic properties, and then, performing electroless plating.

Further, the present indention is a circuit characterized in that the circuit is obtained by the above-mentioned method for forming a circuit on a substrate, and the substrate, a coating film containing a silicone oligomer and a catalyst metal, an electroless plating film, and an electroplating film are stacked in this order.

Further, the present inventors found that by irradiating a desired portion to be plated of a coating film containing a silicone oligomer and a catalyst metal with a visible light at 450 nm or less and an ultraviolet ray, the catalyst metal in the coating film exhibits autocatalytic properties, and thereby, electroless plating can be performed, and thus, completed the present invention.

That is, the present invention is a method for plating a base material characterized in that a coating film containing a silicone oligomer and a catalyst metal is applied onto a base material, and thereafter, a desired portion to be plated is irradiated with a visible light at 450 nm or less and an ultraviolet ray to make the catalyst metal in the coating film exhibit autocatalytic properties, and then, electroless plating is performed.

Advantageous Effects of Invention

According to the present invention, by using a coating film containing a silicone oligomer and a catalyst metal for the formation of a circuit, it is not necessary to perform a pretreatment or the like of each substrate, and therefore, the steps of performing metal plating on a desired portion of a substrate can be reduced regardless of the kind of the substrate.

Therefore, by using the present invention in the production of a semiconductor circuit, the circuit can be formed through a smaller number of steps than conventionally.

In addition, according to the present invention, by irradiating a desired portion to be plated of a coating film containing a silicone oligomer and a catalyst metal provided on a base material with a visible light at 450 nm or less and an ultraviolet ray, the desired portion of the base material can be plated.

Accordingly, the present invention can for used for plating a desired portion of a base material.

DESCRIPTION OF EMBODIMENTS

Figure 1:
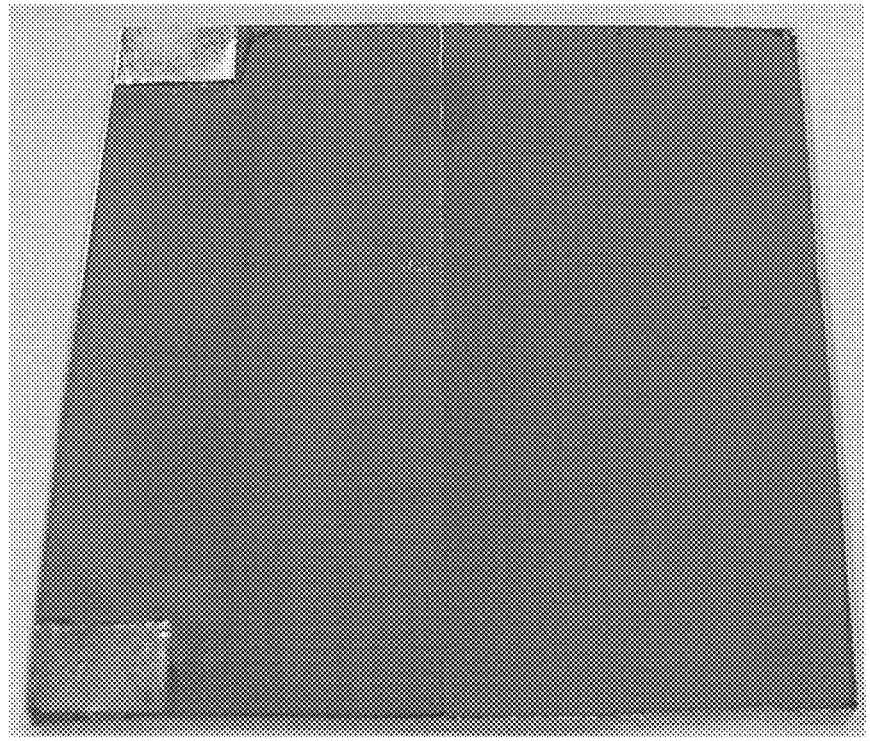
FIG. 1 is photograph of a substrate after plating obtained in Example 1.

The method for forming a circuit on a substrate of the present invention (hereinafter referred to as "the method of the present invention") may only include steps of applying a coating film containing a silicone oligomer and a catalyst metal onto a substrate, and thereafter, performing an activation treatment of the catalyst metal in the coating film to make the catalyst metal exhibit autocatalytic properties, and then, performing electroless plating, when forming the circuit by plating on the substrate.

In the substrate to be used in the method of the present invention, a coating film containing a silicone oligomer and a catalyst metal has favorable adhesiveness and can exhibit autocatalytic properties by an activation treatment, and therefore, the material of the substrate is not particularly limited, and may be any of wood, paper, etc., each of which is conventionally regarded as a hard-to-plate metal, other than a metal, a resin, a glass, etc. Among these, a resin and a glass are preferred. As the resin, for example, ABS, polypropylene, polyethylene, polycarbonate, an epoxy-based resin, a phenolic resin, a urethane-based resin, and the like are exemplified. Among these resins, one kind or two or more kinds can be used. Incidentally, it is preferred to use a material obtained by adding a filler such as an inorganic oxide, an inorganic nitride, or an inorganic sulfide to any of these resins from the viewpoint of adhesion or the like. Among these fillers, one kind or two or more kinds can be added to the resin. Incidentally, in a conventional circuit formation method, when a resin to which a filler is added is used, it is necessary to remove the filler by dipping in an alkali solution or perform a roughening treatment by a desmear treatment or the like, however, in the method of the present invention, such an operation is not needed.

In the method of the present invention, a method of applying the coating film containing a silicone oligomer and a catalyst metal is not particularly limited, and for example, a method of treating a substrate with a coating agent containing the following catalyst metal-containing silicone oligomer is exemplified.

Specifically, a treatment is performed with a coating agent containing a catalyst metal-containing silicone oligomer obtained by a condensation reaction of a tetraalkoxysilane with a polyhydric alcohol in which a hydroxy group is bonded to at least n and n+1 sites, or n and n+2 sites (wherein n is an integer of 1 or more)

in the presence of a catalyst metal.

The tetraalkoxysilane is not particularly limited, and for example, tetramethoxysilane, tetraethoxysilane, tetrabutoxysilane, and the like are exemplified, and among these, tetraethoxysilane is preferred. Among these tetraalkoxysilanes, one kind or two or more kinds may be combined.

Further, the polyhydric alcohol in which a hydroxy group is bonded to at least n and n+1 sites, or n and n+2 sites (wherein n is an integer of 1 or more) is not particularly limited, and for example, dihydric to tetrahydric alcohols wherein n is an integer of 1 to 3, preferably dihydric to trihydric alcohols wherein n is an integer of 1 to 2, and the like are exemplified. Specific examples of these polyhydric alcohols include, for example, dihydric alcohols such as ethylene glycol, 1,2-propanediol, 1,3-propylene glycol, 1,2-butylene glycol, 1,3-butylene glycol, 2,3-butylene glycol, 2-methyl-1,3-propylene glycol, 1,2-pentylene glycol, 1,3-pentylene glycol, 2,3-pentylene glycol, and 2,4-pentylene glycol; trihydric alcohols such as glycerin; and tetrahydric alcohols such as erythritol. Among these polyhydric alcohols, dihydric alcohols are preferred, and ethylene glycol and/or 1,3-propylene glycol are/is more preferred, and ethylene glycol is particularly preferred. Among these polyhydric alcohols, one kind or two or more kinds in combination can be used.

Further, the catalyst metal is not a metal having a catalytic activity for the condensation reaction of a tetraalkoxysilane with a polyhydric alcohol, but a metal having an autocatalytic activity for the below-mentioned plating deposition reaction. Therefore, it is different from the metal catalysts described in WO 2014/207885 and WO 2014/207886. As such a catalyst metal, for example, iron, nickel, cobalt, copper, palladium, silver, gold, platinum, and the like are exemplified. Among these catalyst metals, iron, nickel, cobalt, copper, and palladium are preferred, and iron, nickel, copper, and palladium are more preferred, and palladium is particularly preferred. Incidentally, it is preferred that the catalyst metal is allowed to exist in a state of being dissolved in the above-mentioned polyhydric alcohol in the condensation reaction, and in such a case, it is preferred to use, for example, a metal salt containing the catalyst metal such as iron chloride, nickel chloride, copper chloride, palladium chloride, gold (III) chloride, silver (I) chloride, or platinum (IV) chloride. Incidentally, in the case where it is difficult to dissolve the catalyst metal in the polyhydric alcohol, the catalyst metal may be dissolved in an inorganic acid such as hydrochloric acid beforehand. Among these catalyst metals, one kind or two or more kinds in combination can be used, and in such a case, it is preferred to contain at least palladium.

A method of subjecting the tetraalkoxysilane with the polyhydric alcohol to a condensation reaction in the presence of the catalyst metal is not particularly limited, and for example, the catalyst metal is added to the polyhydric alcohol in an amount of 0.01 to 20 g/kg, preferably 0.1 to 10 g/kg and dissolved therein, and then, heated to a reaction temperature while stirring, and further the tetraalkoxysilane is added thereto and the reaction may be allowed to proceed. The reaction temperature is from 25 to 150° C., preferably from 30 to 70° C., and the reaction time is from 30 minutes to 8 hours, preferably from 2 hours to 4 hours. Incidentally, it is important that in the reaction, the tetraalkoxysilane and the polyhydric alcohol are reacted at a molar ratio of 4:1 to 1:4, more preferably 1:2 to 1:4. Accordingly, the polyhydric alcohol is incorporated between the tetraalkoxysilane and the tetraalkoxysilane.

Incidentally, in the reaction, an alcohol is generated, however, a polymerization, reaction is controlled by not performing fractional distillation of this alcohol, and therefore, it is preferred that the alcohol is not fractionally distilled.

Further, in the above-mentioned reaction, the reaction mixture is separated into two layers before the tetraalkoxysilane and the polyhydric alcohol are subjected to the condensation reaction, however, when the reaction is completed, the two layers are combined into one layer, and therefore, the reaction may be stopped at the time point when the two layers are combined into one layer.

The thus obtained catalyst metal-containing silicone oligomer is a material in which the catalyst metal is incorporated in a silicone oligomer obtained by a condensation reaction of the tetraalkoxysilane (2 to 4 molecules) with the polyhydric alcohol (1 to 13 molecules).

Incidentally, the catalyst metal-containing silicone oligomer is a material obtained by a condensation reaction of an alkoxy group of the tetraalkoxysilane with one or two hydroxy groups at the n and n+1 sites, or the n and n+2 sites present in the polyhydric alcohol, and has, for example, a partial structure as shown in the following (a) to (d). Then, in the catalyst metal-containing silicone oligomer of the present invention, the catalyst metal is present between oxygen atoms and is presumed to be stabilized by forming a 5-membered ring structure or a 6-membered ring structure having the catalyst metal as the vertex. Therefore, in the catalyst metal-containing silicone oligomer of the present invention, the precipitation of the catalyst metal is not observed even if one year elapses after the formation.

[Chem. 1]

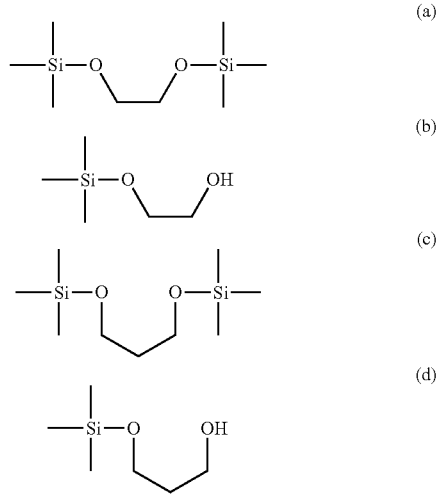

Such a catalyst metal-containing silicone oligomer can be identified by a known method such as NMR such as $^1$H-NMR or $^{29}$Si-NMR, IR, or MASS. Specifically, in the case of NMR, an alcohol generated by a condensation reaction of a tetraalkoxysilane with a polyhydric alcohol is confirmed by $^1$H-NMR, and further, the number of silicon atoms in the catalyst metal-containing silicone oligomer is confirmed by $^{29}$Si-NMR, whereby the catalyst metal-containing silicone oligomer can be identified. Further, the incorporation of the catalyst metal in the silicone oligomer can be confirmed by the fact that the precipitation of the catalyst metal is not observed after the elapse of a certain period of time, for example, after the elapse of one year from the formation of the silicone oligomer.

This catalyst metal-containing silicone oligomer can be used for treating the surface or the like of a substrate as a coating agent in the same manner as a conventional silicone oligomer. In particular, in this catalyst metal-containing silicone oligomer, the catalyst metal is incorporated into its structure, and therefore, by performing an activation treatment after treating a substrate with the coating agent, autocatalytic properties or electrical conductivity can be imparted to the substrate.

The coating agent containing the catalyst metal-containing silicone oligomer may only contain the catalyst metal-containing silicone oligomer, however, for example, by using two or more kinds of catalyst metal-containing silicone oligomers in which the contained catalyst metals are different in combination, or by using a catalyst metal-containing silicone oligomer prepared in the presence of two or more kinds of catalyst metals in the preparation of the catalyst metal-containing silicone oligomer, the catalytic activity of the catalyst metal is enhanced, and therefore, such a coating agent is preferred. Further, the combination of the catalyst metals is not particularly limited, but for example, a combination of palladium with one or more kinds selected from iron, nickel, cobalt, and copper is preferred.

In the coating agent, for example, a solvent to be added to a conventionally known coating agent, a resin for improving wettability to the substrate, or the like may be contained. Such a coating agent can be prepared by stirring and mixing the above-mentioned components as appropriate.

The solvent to be added to the above-mentioned coating agent is not particularly limited, and for example, water, isopropyl alcohol, ethyl cellosolve, and the like are exemplified. Incidentally, the catalyst, metal-containing silicone oligomer of the present invention can be stably stored even in the presence of moisture if it is diluted with, for example, a glycol-based solvent such as polyethylene glycol or ethyl cellosolve. In particular, by using polyethylene glycol 200 to 1000, preferably polyethylene glycol 200 as the glycol-based solvent, the silicone oligomer can be stably stored for a long period of time even in the presence of moisture.

Further, the resin to be added to the above-mentioned coating agent is not particularly limited as long as it is soluble in the coating agent or dispersed therein, and for example, an acrylic resin, a urethane-based resin, a phenolic resin, an epoxy-based resin, and the like are exemplified. Further, among these resins, an acrylic resin is preferred, and an alkyl methacrylate ester copolymer, a colloidal silica-acrylic composite, and an ethylene-acrylic acid copolymer ammonium salt are more preferred, and an alkyl methacrylate ester copolymer is particularly preferred. Among these resins, one kind or two or more kinds can be used. Further, these resins may be in the form of either a solution or a powder. These resins are blended in the coating agent in an amount of 50 mass % (hereinafter simply referred to as "%") or less, preferably from 0.1 to 50%, more preferably from 1 to 20%.

Further, in the above-mentioned coating agent, a coloring agent, a friction coefficient adjusting agent, a film growth agent, or an additive which imparts another function may be blended within a range that does not impair the effect of the catalyst metal-containing silicone oligomer.

The method of treating the substrate with the above-mentioned coating agent may be the same as that for a conventionally known coating agent, and for example, the entire surface of the substrate may be treated by a dipping method such as a dip and spin method, a spraying method such as a spray coating method, or the like. After the above-mentioned treatment, the coating agent may be let to dry or dried with warm air or the like. Further, the thickness of the coating is not particularly limited, and it is only necessary to cover the entire surface, of the substrate.

After the coating film containing the silicone oligomer and the catalyst metal is applied onto the substrate as described above, an activation treatment of the catalyst metal in the coating film is performed so as to make the catalyst metal exhibit autocatalytic properties.

In the activation treatment of the catalyst metal, the activation treatment may be performed as appropriate in accordance with the properties of the substrate. As the activation treatment, for example, irradiation with a visible light at 450 nm or less and an ultraviolet ray, heating, chemical redaction, and the like are exemplified. These activation treatments may be combined as appropriate. Among these activation treatments, the irradiation with a visible light at 450 nm or less and an ultraviolet ray is preferred because it is independent of the kind of the substrate, and irradiation with a light at 254 nm to 365 nm, by which ozone is not generated, is particularly preferred.

The irradiation with a visible light at 450 nm or less and an ultraviolet ray may be performed for about several minutes using, for example, an ultraviolet, ray irradiation device such as a DUV exposure light source device (UIS-2511DUZ8-AUM01, manufactured by Ushio, Inc.), or the like.

The heating is not particularly limited, and for example, the above-mentioned temperature may be maintained for 10 minutes to 2 hours using an oven, an electric furnace, or the like. The atmosphere in the heating treatment is not particularly limited and may be air. After the heating, the heated material may be let to cool or the like.

The chemical reduction is not particularly limited, and for example, dipping in an aqueous solution or the like containing a reducing agent may be performed for about 1 to 3 minutes. As the reducing agent, for example, hypophosphorous acid, dimethylamine borane, formaldehyde, sodium borohydride, hydrazine, and the like are exemplified. Among these reducing agents, one kind or two or more kinds can be used. After the chemical reduction, washing with water, drying, or the like may be performed.

By the activation treatment of the catalyst metal as described above, also the catalyst metal in the coating film exhibits autocatalytic properties.

After this activation treatment of the catalyst metal, electroless plating is performed. The kind of the electroless plating is not particularly limited, and for example, electroless copper plating, electroless nickel plating, electroless copper-nickel plating, and the like are exemplified. Further, the conditions for the electroless plating may be set as appropriate in accordance with a required plating thickness, and therefore are not particularly limited, and for example, conditions in which the pH is about 9, the liquid temperature is about 40° C., the treatment time is about 7 minutes, etc. are exemplified.

When forming a circuit by plating on a substrate, if the method (step) of the present invention described above is included, the circuit can be formed on the substrate. As a method for forming a circuit by plating on a substrate, various known methods are exemplified.

Specifically, as the method for forming a circuit by plating on a substrate using the method of the present invention, in the activation treatment of the catalyst metal, even if the activation treatment is performed only on a circuit forming portion on the substrate, and thereafter, electroless plating is performed, and further, electroplating is performed, the circuit can be formed on the substrate. The kind of the electroplating is not particularly limited, and for example, copper electroplating and the like are exemplified. Further, also the conditions for the electroplating may be set as appropriate in accordance with a required plating thickness, and therefore are not particularly limited, and for example, conditions in which electroplating is performed at about 3 A/dm$^2$ for about 10 to 60 minutes, etc. are exemplified. As a method of performing the activation treatment only on a circuit-forming portion, for example, a method in which a coating film is applied only to the circuit-forming portion on the substrate using a mask or the like on the substrate, a method in which a coating film is applied to the entire surface of the substrate, and the activation treatment is performed only on the circuit-forming portion, on the substrate using a mask or the like, etc. are exemplified. Among these methods, a method in which a coating film is applied to the entire surface of the substrate, and the activation treatment is performed only on the circuit-forming portion on the substrate using a mask or the like is preferred, and a method in which the activation treatment is performed by irradiation with a visible light at 450 nm or less and an ultraviolet ray, and the activation treatment is performed only on the circuit-forming portion on the substrate is particularly preferred.

Further, as another method for forming a circuit by plating on a substrate using the method of the present invention, in the activation treatment of the catalyst metal, the activation treatment is performed on the substrate, preferably on the entire surface of the substrate, electroless plating is performed, and thereafter, for example, the following steps (a1) to (e1), (a2) to (e2), etc. are performed, whereby a circuit can be formed on the substrate. Incidentally, the steps (a1) to (e1) correspond to a circuit formation method generally called "semi-additive method", and the steps (a2) to (e2) correspond to a circuit formation method generally called "subtractive method".

(a1) a step of providing a dry film on a non-circuit forming portion (b1) a step of performing electroplating on a circuit forming portion (c1) a step of removing the dry film (d1) a step of removing an electroless plating film on the non-circuit forming portion (e1) a step of removing the coating film on the non-circuit forming portion (a2) a step of performing electroplating (b2) a step of providing a dry film on a circuit forming portion (c2) a step of removing an electroless plating film and an electroplating film on a non-circuit forming portion (d2) a step of removing the coating film on the non-circuit forming portion (e2) a step of removing the dry film Among the above-mentioned steps, the step of providing a dry film on a non-circuit forming portion (a1) is not particularly limited, and, for example, the dry film may be provided by utilizing exposure development by UV using a general photosensitive resist on the non-circuit forming portion of an electroless plating film.

The step of performing electroplating on a circuit forming portion (b1) subsequent to the step (a1) is not particularly limited, and for example, plating may be performed by dipping in an electroplating solution under usual conditions until a desired thickness is obtained. The kind of the electroplating solution is not particularly limited, and for example, copper electroplating and the like are exemplified. By this step, only the circuit forming portion is plated.

The step of removing the dry film (c1) subsequent to the step (b1) is not particularly limited, and a treatment may be performed as appropriate in accordance with the kind of the dry film and using an organic solvent, an alkaline aqueous solution, or the like capable of dissolving the dry film. The treatment method is not particularly limited, and may be dipping, spraying, or the like.

The step of removing an electroless plating film on the non-circuit forming portion (d1) subsequent to the step (c1) is not particularly limited, and a treatment may be performed using an acid or the like capable of dissolving the electroless plating film. The kind of the acid is not particularly limited, but for example, in the case where the electroless plating film is copper, sulfuric acid and the like are exemplified. Further, the treatment method is not particularly limited, and may be dipping, spraying, or the like.

The step of removing the coating film on the non-circuit forming portion (e1) subsequent to the step (d1) is not particularly limited, but for example, the coating film may be decomposed and removed by irradiating the non-circuit forming portion with an energy sufficient for cleaving a carbon-oxygen bond (C—O) and/or a carbon-carbon bond (C—C) between silicon atoms in the coating film using a mask or the like.

The energy sufficient for cleaving a carbon-oxygen bond, between silicon atoms in the coating film is 3.7 eV or more, and the energy sufficient for cleaving a carbon-carbon bond between silicon atoms in the coating film is 3.6 eV or more. If a carbon-oxygen bond and/or a carbon-carbon bond between silicon atoms in the coating film are/is cleaved, the coating film is decomposed. Therefore, the energy to be applied to the coating film is preferably 3.6 eV or more, at which a carbon-carbon bond is cleaved, and 8.7 eV, at which, a silicon-oxygen bond (Si—O) is cleaved, or less, more preferably from 3.6 to 4.0 eV. This energy may be irradiated for about 10 minutes. Whether or not such an energy is applied can be confirmed by, for example, testing whether only the coating film can be removed without affecting the substrate by irradiating the substrate provided with the above-mentioned coating film with the energy.

Such an energy for decomposing the coating film can be applied by, for example, a plasma, an ultraviolet ray, a laser, or the like, hut it is preferably applied by a plasma.

Specifically, in the case of an ultraviolet ray, the irradiation with the energy can be performed using an ultraviolet ray irradiation device. Further, in the case of a laser, it can be performed using a laser irradiation device such as a solid laser, a gas laser, or a semiconductor laser.

Further, in the case of a plasma, it can be performed by so-called dry etching. The dry etching can be performed by a plasma of a mixed gas containing a halogen compound generated under a pressure not higher than the atmospheric pressure, for example, a low-vacuum plasma or a high-vacuum plasma. As the halogen compound, carbon tetrafluoride and the like are exemplified. Further, as the gas to be mixed with the halogen compound, nitrogen gas, oxygen gas, a rare gas, and the like are exemplified. Incidentally, in the dry etching, a general plasma etching device can be used.

The coating film on the non-circuit forming portion can be removed as described above, however, thereafter, the catalyst metal remaining on the non-circuit forming portion of the substrate may be removed with a solution which dissolves the catalyst metal.

The solution which dissolves the catalyst metal is not particularly limited, but for example, an acidic aqueous solution is preferred. In order to make the aqueous solution acidic, for example, an inorganic acid such as hydrochloric acid or sulfuric acid can be used. In order to remove the catalyst metal remaining on the non-circuit forming portion of the substrate with the solution which dissolves the catalyst metal, the substrate may be dipped or the like in the solution which dissolves the catalyst metal.

By these operations, the coating film and the catalyst metal on the non-circuit forming portion are completely removed. By performing this step, only the circuit is left on the substrate.

Further, among the above-mentioned steps, the step of performing electroplating (a2) is not particularly limited, and for example, plating may toe performed by dipping in an electroplating solution under usual conditions until a desired thickness is obtained. The kind of the electroplating solution is not particularly limited and for example, copper electroplating and the like are exemplified. By this step, the entire surface of the substrate is plated.

The step of providing a dry film on a circuit forming portion (2) subsequent to the step (a2) is not particularly limited, and for example, the dry film may be provided by utilizing exposure development by UV using a general photosensitive resist on the non-circuit forming portion of the electroplating film.

The step of removing an electroless plating film and an electroplating film on a non-circuit forming portion (c2) subsequent to the step (b2) is not particularly limited, and a treatment may be performed using an acid or the like capable of dissolving the electroless plating film or the electroplating film. The kind of the acid is not particularly limited, but for example, in the case where the electroplating film is copper, sulfuric acid and the like are exemplified. Further, the treatment method is not particularly limited, and may be dipping, spraying, or the like.

The step of removing the coating film on the non-circuit forming portion (d2) subsequent to the step (c2) can be performed in the same manner as the step (e1).

The step of removing the dry film (e2) subsequent to the step (d2) can be performed in the same manner as the step (c1). By performing this step, only the circuit is left on the substrate.

A treatment which is generally performed such as washing or drying may be performed between or after the above-mentioned steps (a1) to (e1) or (a2) to (e2).

Further, after finishing the above-mentioned steps (a1) to (e1) or (a2) to (e2), part or all of the method of the present invention may be performed repeatedly.

By the above-mentioned steps, the circuit in which the substrate, the coating film containing a silicone oligomer and a catalyst metal, the electroless plating film, and the electroplating film are stacked in this order on the substrate can be obtained.

Incidentally, when a coating film containing a silicone oligomer and a catalyst metal is applied to a base material, and thereafter, a desired portion to be plated is irradiated with a visible light at 450 nm or less and an ultraviolet ray to make the catalyst metal in the coating film exhibit autocatalytic properties, and then, electroless plating is performed, the desired portion of the base material can be plated. Further, after the electroless plating, various electroplating or the like may be performed.

The base material is not particularly limited, and the same material as the substrate described above can be used. Further, in the irradiation of the desired portion to be plated with a visible light at 450 nm or less and an ultraviolet ray, a mask or the like is used, or the coating film containing a silicone oligomer and a catalyst metal may be applied only to the desired portion to be plated of the base material beforehand.

Further, a portion which is not desired to be plated of the base material is irradiated with an energy sufficient for cleaving a carbon-oxygen bond (C—O) and/or a carbon-carbon bond (C—C) between silicon atoms in the coating film using a mask or the like, whereby the coating film may be decomposed and removed in the same manner as in the above-mentioned (e1) or (d2), or further, the catalyst metal may be removed with a solution which dissolves the catalyst metal.

EXAMPLES

Hereinafter, the present invention will be described in detail by showing Examples, however, the present invention is by no means limited to these Examples.

Production Example 1

Preparation of Palladium-Containing Silicone Oligomer 1.7 g of palladium chloride previously dissolved in 1.7 g of hydrochloric acid was added to 336 g of ethylene glycol, and then dissolved therein by stirring. Thereto, 564 g of tetraethoxysilane was added, followed by stirring for 2 hours while heating to 50° C. with a mantle heater to effect a condensation reaction, whereby a reaction product was obtained. Incidentally, an alcohol generated in this reaction was not fractionally distilled. Further, before this reaction, ethylene glycol and tetraethoxysilane were immiscible and separated into two layers, however, after the condensation reaction for 2 hours, the two layers were combined into one layer. Therefore, the reaction ratio of this reaction was found to be 100%.

Cooling was performed after the reaction, whereby a reaction product was obtained. $^1$H-NMR and $^{29}$Si-NMR were measured before and after the reaction. In the $^1$H-NMR, peaks derived from ethanol appeared at around 1.1 and 3.5 ppm in the spectrum after completion of the reaction. This ethanol was considered to be produced as a result of the occurrence of the condensation reaction of an ethoxy group of tetraethoxysilane with ethylene glycol.

Further, in the $^{29}$Si-NMR, only a single peak derived from tetraethoxysilane appeared at around −82 ppm in the spectrum before the reaction, however, a plurality of peaks appeared in a range from −90 ppm to −80 ppm in the spectrum after completion of the reaction. Based on these, it was considered that the number of Si atoms in the molecule is 2 to 4.

Further, in the silicone oligomer obtained above, precipitation of palladium was not observed even after the elapse of one year. Based on this, it was considered that palladium is incorporated into the structure of the silicone oligomer (hereinafter this is referred to as "Pd-containing silicone oligomer").

Production Example 2

Preparation of Coating Agent (1)

A coating agent was obtained by adding and mixing an acrylic resin (NIKASOL PK8012P, manufactured by Nippon Carbide Industries Co., Inc.) in an amount of 10 mass % and the Pd-containing silicone oligomer obtained in Production Example 1 in an amount of 12.5 mass % (metal concentration: 300 ppm).

Production Example 3

Preparation of Coating Agent (2)

A coating agent was obtained by adding and mixing an acrylic resin (NIKASOL PK8012P, manufactured by Nippon Carbide Industries Co., Inc.) in an amount of 10 mass % and the Pd-containing silicone oligomer obtained in Production Example 1 in an amount of 12.5 mass % (metal concentrations: 300 ppm).

Example 1

Selective Plating on Substrate (1)

An ABF substrate (GX-T31, manufactured by Ajinomoto Co., Inc.) was degreased (SK-18, manufactured by JCU Corporation) at 60° C. for 1.5 minutes, and then dried. Subsequently, the ABF substrate was dipped in the coating agent obtained in Production Example 2 for 10 seconds and dried at room temperature for 5 minutes. Thereafter, firing was performed at 70° C. for 20 minutes, and the fired substrate was let to cool, whereby a coating film was provided. After cooling, the entire surface of the ABF substrate was irradiated with an ultraviolet ray with a wavelength of 365 nm for 5 minutes, thereby making the catalyst metal exhibit autocatalytic properties. After irradiation with the ultraviolet ray, electroless nickel plating was performed by dipping the substrate in an electroless nickel plating solution (SKYLITE PB-606, manufactured by JCU Corporation) at 80° C. for 2 minutes. After plating, a dry film was attached to the right half (on the electroless nickel plating film) of the substrate, and then, plating was performed at 3 A/dm$^2$ for 40 minutes in a cooper sulfate plating solution (CU-BRITE EP-30, manufactured by JCU Corporation) at 25° C. After plating, the dry film was removed with a sodium hydroxide aqueous solution, and further the unnecessary electroless copper plating film beneath the dry film was removed by performing etching with sulfuric acid, and finally, the coating film beneath the electroless copper plating film was removed using a plasma treatment device (TAIKAI, manufactured by JCU Corporation).

By these operations, the plating film was deposited only on the portion to which the dry film was not attached, and the other portion remained in a state of the substrate (FIG. 1). This indicated that selective plating can be performed on the substrate, and also indicated that a circuit can be formed by this method.

Example 2

Selective Plating on Substrate (2)

An ABF substrate (GX-T31, manufactured by Ajinomoto Co., Inc.) was degreased (SK-18, manufactured by JCU Corporation) at 60° C. for 1.5 minutes, and then dried. Subsequently, the ABF substrate was dipped in the coating agent obtained in Production Example 3 for 10 seconds and dried at room temperature for 5 minutes. Thereafter, firing was performed at 70° C. for 20 minutes, and the fired substrate was let to cool, whereby a coating film was provided. After cooling, the entire surface of the ABF substrate was irradiated with an ultraviolet ray with a wavelength of 365 nm for 5 minutes, thereby making the catalyst metal exhibit autocatalytic properties. After irradiation with the ultraviolet ray, electroless nickel plating was performed by dipping the substrate in an electroless nickel plating solution (SKYLITE PB-606, manufactured by JCU Corporation) at 80° C. for 2 minutes. Thereafter, plating was performed at 3 A/dm$^2$ for 40 minutes in a copper sulfate plating solution (CU-BRITE EP-30, manufactured by JCU Corporation) at 25° C. After plating, a dry film was attached to the right half (on the copper sulfate plating film) of the substrate, and then, the unnecessary copper sulfate plating film and electroless nickel plating film were removed by performing etching with sulfuric acid, and the coating film beneath the electroless nickel plating film was removed using a plasma treatment device (TAIKAI, manufactured by JCU Corporation), and finally, the dry film was removed with a sodium hydroxide aqueous solution.

Figure 2:
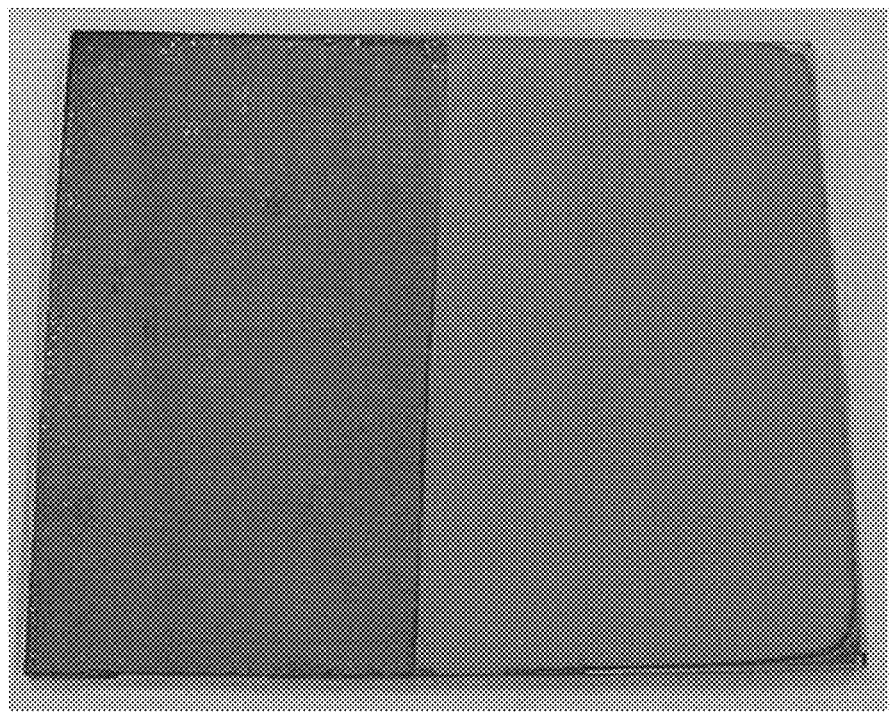
FIG. 2 is photograph of a substrate after plating obtained in Example 2.

By these operations, the plating film remained only on the portion to which the dry film was attached, and the other portion remained in a state of the substrate (FIG. 2). This indicated that selective plating can be performed on the substrate, and also indicated that a circuit can be formed by this method.

Example 3

Selective Plating on Substrate (3)

A glass substrate was degreased (SK-18, manufactured by JCU Corporation) at 60° C. for 1.5 minutes, and then dried. Subsequently, the glass substrate was dipped in the coating agent obtained in Production Example 3 for 10 seconds and dried at room temperature for 5 minutes. Thereafter, firing was performed at 180° C. for 20 minutes, and the fired substrate was let to cool, whereby a coating film was provided. Incidentally, by this firing, the catalyst metal was made to exhibit autocatalytic properties. Thereafter, electroless copper-nickel plating was performed by dipping the substrate in an electroless copper-nickel plating solution (AISL-570, manufactured by JCU Corporation) at 40° C. for 5 minutes. Thereafter, firing was performed at 180° C. for 20 minutes, and further plating was performed at 3 A/dm² for 40 minutes in a copper sulfate plating solution (CU-BRITE EP-30, manufactured by JCU Corporation) at 20° C. After plating, a dry film was attached to the right half (on the copper sulfate plating film) of the substrate, and then, the copper sulfate plating film and the electroless cooper-nickel plating film were removed by performing etching with sulfuric acid, and the coating film was removed using a plasma treatment device (TAIKAI, manufactured by JCU Corporation), and finally, the dry film was removed with a sodium hydroxide aqueous solution.

Figure 3:
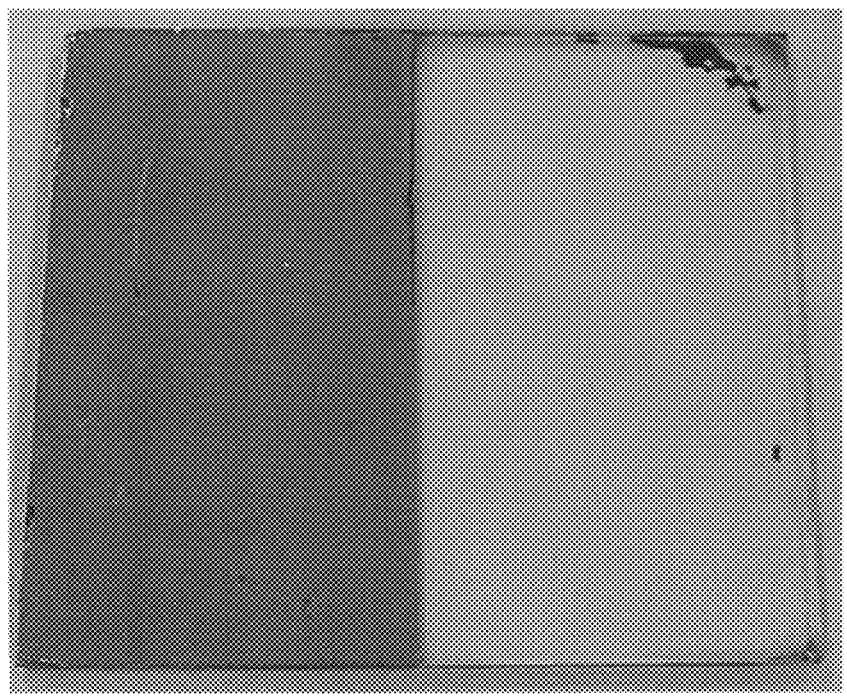
FIG. 3 is photograph of a substrate after plating obtained in Example 3.

By these operations, the plating film was deposited only on the portion to which the dry film was attached, and the other portion remained in a state of the substrate (FIG. 3). This indicated that selective plating can be performed on the substrate, and also indicated that a circuit can be formed by this method.

Example 4

Selective Plating on Substrate (4)

Figure 4:
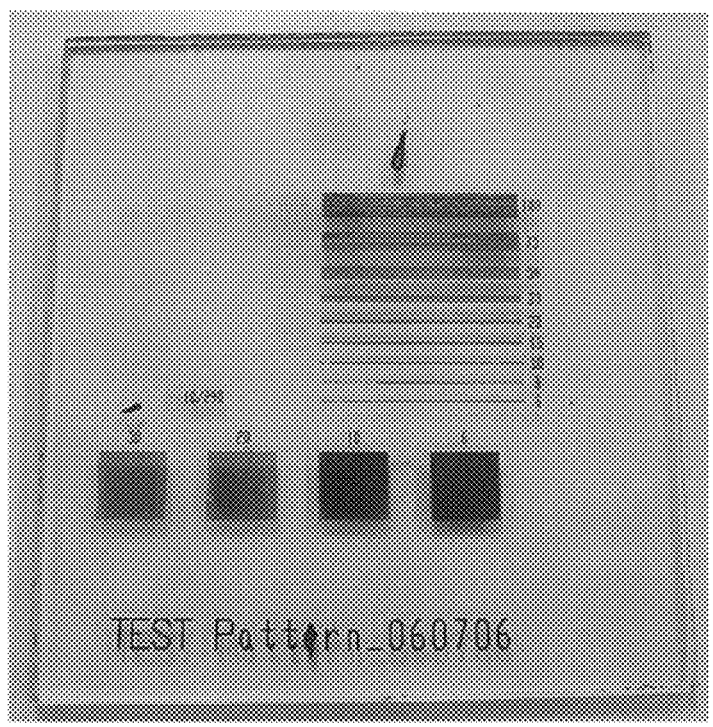
FIG. 4 is photograph of a substrate after plating obtained in Example 4.

An ABF substrate (GX-T31, manufactured by Ajinomoto Co., Inc.) was degreased (SK-18, manufactured by JCU Corporation) at 60° C. for 1.5 minutes, and then dried. Subsequently, the ABF substrate was dipped in the coating agent obtained in Production Example 3 for 10 seconds and dried at room temperature for 5 minutes. Thereafter, firing was performed at 70° C. for 20 minutes, and the fired substrate was let to cool, whereby a coating film was provided. After cooling, a glass photomask with a circuit pattern drawn thereon was overlaid on the ABF substrate, and irradiated with an ultraviolet ray with a wavelength of 365 nm for 5 minutes. After irradiation with the ultraviolet ray, the mask was removed, and electroless nickel plating was performed by dipping the substrate in an electroless nickel plating solution (SKYLITE PB-606, manufactured by JCU Corporation) at 80° C. for 2 minutes, whereby the deposition of an electroless nickel film was confirmed only on the exposed portion (FIG. 4).

INDUSTRIAL APPLICABILITY

The method of the present invention can be used for forming a circuit such as an integrated circuit.

The invention claimed is:

1. A method for forming a circuit by plating on a substrate, the method comprising:
    forming a coating film comprising a silicone oligomer and a catalyst metal with a catalyst metal-containing silicone oligomer obtained by a condensation reaction of a tetraalkoxysilane with a polyhydric alcohol,
    applying the coating film onto the substrate,
    performing an activation treatment of the catalyst metal in the coating film to activate the catalyst metal, thereby forming a catalyst metal exhibiting autocatalytic properties, and
    performing electroless plating, thereby forming an electroless plating film,
    wherein the catalyst metal is iron, nickel, cobalt, copper, palladium or a mixture thereof and
    the catalyst metal-containing silicone oligomer comprises at least one of the following partial structures (a) to (d):

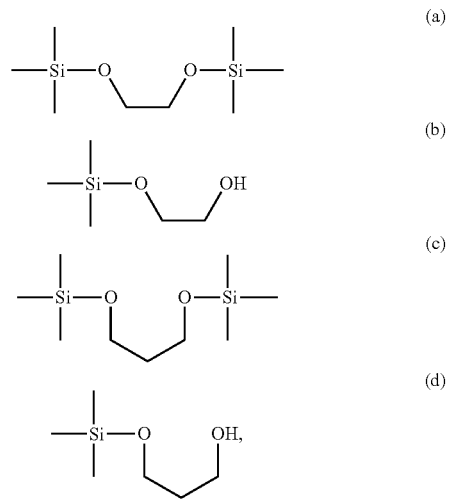

wherein a catalyst metal in the catalyst metal-containing silicone oligomer is present between oxygen atoms and forms a 5-membered ring structure or a 6-membered ring structure having the catalyst metal as the vertex.

2. The method according to claim 1, further comprising: after the electroless plating,
    (a1) providing a dry film on a non-circuit forming portion,
    (b1) performing electroplating on a circuit forming portion,
    (c1) removing the dry film,
    (d1) removing an electroless plating film on the non-circuit forming portion, and
    (e1) removing the coating film on the non-circuit forming portion.

3. The method according to claim 1, further comprising: after the electroless plating is performed,
    (a2) performing electroplating,
    (b2) providing a dry film on a circuit forming portion,
    (c2) removing an electroless plating film and an electroplating film on the non-circuit forming portion, (d2) removing the coating film on the non-circuit forming portion, and
(e2) removing the dry film.

4. The method according to claim 1, wherein the activation treatment of the catalyst metal in the coating film is performed only on a circuit forming portion.

5. The method according to claim 1, wherein a hydroxy group of the polyhydric alcohol is bonded to at least n and n+1 sites, or n and n+2 sites, where n is an integer of 1 or more.

6. The method according to claim 1, wherein an alcohol generated in the condensation reaction is not fractionally distilled.

7. The method according to claim 1, wherein the tetraalkoxysilane is tetramethoxysilane, tetraethoxysilane, tetrabutoxysilane or a mixture thereof.

8. The method according to claim 1, wherein the polyhydric alcohol is ethylene glycol and/or 1,3-propylene glycol.

9. The method according to claim 1, wherein the activation treatment of the catalyst metal is irradiation with a visible light at 450 nm or less or an ultraviolet ray.

10. The method according to claim 1, wherein the substrate is a resin or a glass.

11. The method according to claim 1, wherein the substrate is a material obtained by adding at least one filler to a resin and
the at least one filler is an inorganic oxide, an inorganic nitride, an inorganic sulfide, or a mixture thereof.

12. The method according to claim 11, wherein the resin is ABS, polypropylene, polyethylene, polycarbonate, an epoxy-based resin, a phenolic resin, a urethane-based resin, or a mixture thereof.

13. A circuit, obtained by the method according to claim 1, wherein the substrate, the coating film, and the electroless plating film are stacked in this order.

14. A method for plating a base material, the method comprising:
forming a coating film comprising a silicone oligomer and a catalyst metal with a catalyst metal-containing silicone oligomer obtained by a condensation reaction of a tetraalkoxysilane with a polyhydric alcohol,
applying the coating film onto the base material,
irradiating a desired portion to be plated with a visible light at 450 nm or less or an ultraviolet ray to activate the catalyst metal in the coating film, thereby forming a catalyst metal exhibiting autocatalytic properties, and
performing electroless plating,
wherein catalyst metal is iron, nickel, cobalt, copper, palladium or a mixture thereof, and
wherein the catalyst metal-containing silicone oligomer comprises at least one of the following partial structures (a) to (d):

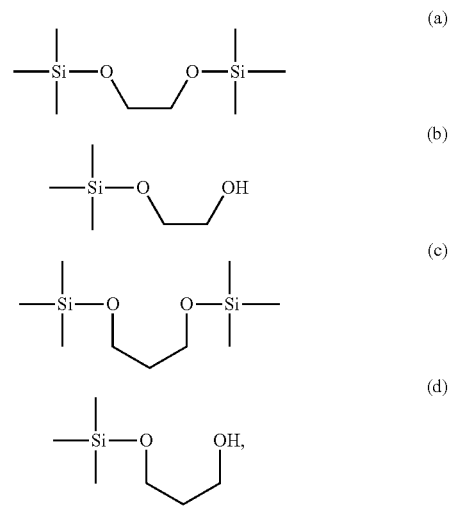

wherein a catalyst metal in the catalyst metal-containing silicone oligomer is present between oxygen atoms and forms a 5-membered ring structure or a 6-membered ring structure having the catalyst metal as the vertex.

15. The method according to claim 14, wherein the base material is a resin or a glass.

16. The method according to claim 14, wherein the base material is a material obtained by adding at least one filler to a resin and
the at least one filler is an inorganic oxide, an inorganic nitride, an inorganic sulfide, or a mixture thereof.

17. The method according to claim 16, wherein the resin is ABS, polypropylene, polyethylene, polycarbonate, an epoxy-based resin, a phenolic resin, a urethane-based resin, or a mixture thereof.

18. The method according to claim 1, further comprising:
performing electroplating followed by the performing electroless plating, thereby forming an electroplating film.

19. The method according claim 1, wherein the condensation reaction is carried out at 30 to 70° C.

* * * * *